United States Patent [19]

Long

[11] Patent Number: 5,831,478
[45] Date of Patent: Nov. 3, 1998

[54] FEEDFORWARD AMPLIFIER

[75] Inventor: James Frank Long, Glen Ellyn, Ill.

[73] Assignee: Motorola, Inc., Schaumburg, Ill.

[21] Appl. No.: 940,545

[22] Filed: Sep. 30, 1997

[51] Int. Cl.$^6$ .............................. H03F 3/66; H03F 1/26
[52] U.S. Cl. ............................................. 330/52; 330/151
[58] Field of Search ........................... 330/52, 149, 151; 455/126

[56] References Cited

U.S. PATENT DOCUMENTS

| | | | |
|---|---|---|---|
| 5,130,663 | 7/1992 | Tattersall | 330/52 |
| 5,166,634 | 11/1992 | Narahashi et al. | 330/151 |
| 5,576,659 | 11/1996 | Kenington et al. | 330/52 |
| 5,610,554 | 3/1997 | Avari | 330/52 |
| 5,724,344 | 3/1998 | Beck | 330/52 X |

*Primary Examiner*—Steven Mottola
*Attorney, Agent, or Firm*—Sayed Hossain Beladi

[57] ABSTRACT

A method and apparatus in a feedforward amplifier (100) includes a summer (293) summing the desired signal (12) with a pair of tag signals (241, 242). An error signal (226) is coupled with a delayed version of the summed signal (48). The phase and amplitude of signals (226, 237) are adjusted according to a first and second gradient decent controllers (221, 231) output signal (225) which is based on the first DC signal (224) and output signal (235). The output signal (235) is based on the detected power level of a leaked signal at the output coupler (62). The adjustment of the input signal (237) to the second amplifier, when the detected power level fluctuation exceeds a predetermined threshold level, is repeated. The tag signals (241) are produced in phase lock with the sweeping detecting (222) function.

11 Claims, 6 Drawing Sheets

FEEDFORWARD AMPLIFIER

FIELD OF THE INVENTION

This invention relates generally to amplifier circuits, and more particularly to amplifier circuits for use in a radio frequency communication system.

BACKGROUND OF THE INVENTION

Conventional feed-forward amplifiers can be generally placed into various categories identified as types I, II, and III, based on the way a desired signal and an error signal are routed through various amplifiers and couplers forming a feed-forward loop. An amplifier is generally rated for both its efficiency and linearity. Accordingly, the type of amplifier selected for use in a radio frequency communication system depends on its combination of efficiency and linearity.

Type III feed-forward amplifier offers a compromise between efficiency and linearity performance without undesirably reducing the communication system power gain. One such amplifier is disclosed in a United States issued patent, title: Amplifier circuit and method of controlling an amplifier for use in a radio frequency communication system, by Everline et al, U.S. Pat. No. 5,623,227, issued Apr. 22, 1997, herein incorporated by reference, which is assigned to Motorola, Inc., Schaumburg, Ill., USA, the assignee of the present invention. For optimum type III feed-forward amplifier performance, desired signal and error signal phase and amplitude are adjusted at various points of the feedforward amplifier circuit. These adjustments should be accomplished and controlled by a stable and practical method.

In some cases, the controlling method involves injecting an external error signal along with the desired signal into the amplifier inputs. The desired signal is the only signal that should be present at the output of the amplifier at an amplified level. One such method is disclosed in a United States issued patent, title: Method and apparatus for feedforward power amplifier, by Mitzlaff, U.S. Pat. No. 5,444,418, issued Aug. 22, 1995, herein incorporated by reference, which is assigned to Motorola, Inc., Schaumburg, Ill., USA, the assignee of the present invention.

For ease of integrating a type III feed forward amplifier within a communication system, a practical and low cost control method should readily be available. Variations among the components of the amplifier, as a result of variations in the amplifier operating point, supply voltage and temperature, prevents predetermined adjustments to the amplifier circuits. Therefore, a need exists for providing a method for controlling type III feed-forward amplifiers which easily integrates within a product.

DETAILED DESCRIPTION OF THE PREFERRED EMBODIMENT(S)

Figure 1:
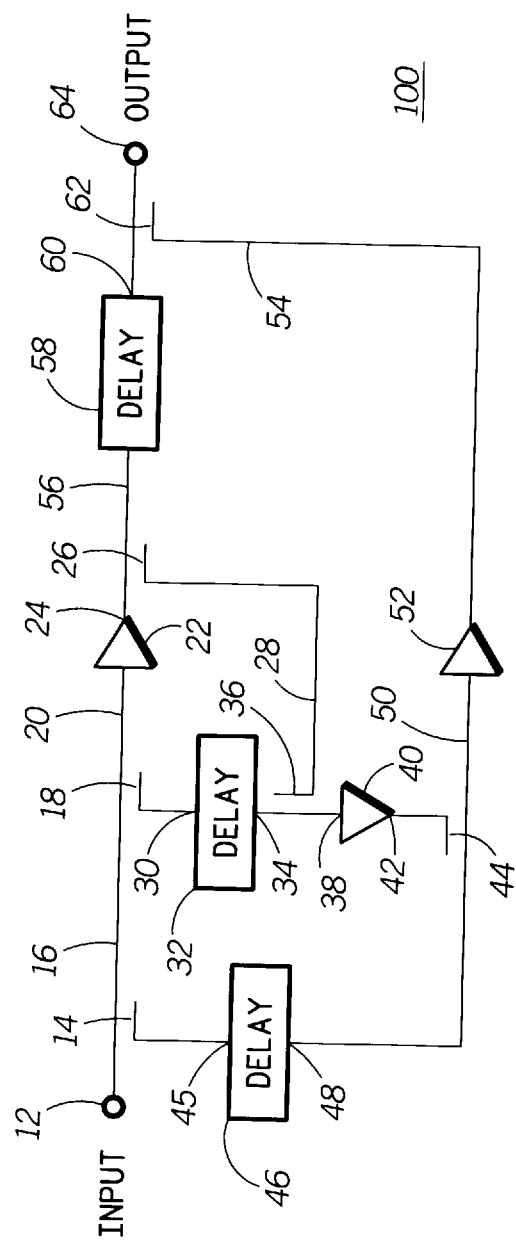
FIG. 1 depicts a type III feedforward amplifier.

In a feedforward amplifier having a first and second parallel amplifying paths, the first and second paths each includes a first amplifier and a second amplifier. A desired signal to be amplified by the feedforward amplifier is summed with a pair of tag signals producing a summed signal. The summed signal is split into a first signal and a second signal. The first and second split signals are correspondingly inputted to the first and second amplifying paths producing a first and second amplified signals. The first and second amplified signals are coupled in a first coupler producing an amplified desired signal. A method, according to one aspect of the present invention, for producing the amplified desired signal includes canceling from a sample of the first amplified signal components of the desired signal, thereby, leaving an error signal which is present at output of the first amplifier. Further, the method includes coupling the error signal with the second split signal before being inputted to the second amplifier. The power level sampled from the first coupler is input to a detector. The amplitude and phase of a coupled signal produced at the coupling step are adjusted according to a first gradient decent controller output signal which is based on the detected power level of the sampled signal.

Furthermore, the amplified desired signal is being swept for detecting components of error signals. The accumulation of this detection produces a DC signal representing an average total power of error signals present in the amplified desired signal. The phase and amplitude of the error signal are adjusted before the coupling step according to a second gradient decent controller output signal which is based on the DC signal produced in the sweeping step.

The method further includes the step of repeating the sweeping step and the adjusting step of the error signal while monitoring the detected power level fluctuations. The adjustment of the coupled signal, when the detected power level fluctuation exceeds a predetermined threshold level, is repeated.

Therefore, according to various aspects of the present invention, a practical method for controlling a feedforward amplifier is available which easily integrates within a product. The use of tag signals with frequencies out of the communication system frequency bandwidth to create detectable intermodulation products forming an error signal such that the feedback system operates in a stable mode. The use of tag signals in accordance with the present invention provides a deterministic level of IM products, whereby, controlling the effectiveness and stability of the control loops in reducing the IM products from the output signal. The present invention provides a method for IM suppression and carrier cancellation control loops to work simultaneously, whereby, providing a greater speed in converging the output signal substantially free of IM products. The components of the control loops according to the present invention are low cost components and readily available. The sweeping operation can be performed by a low cost receiver. The function of gradient decent controller can easily be integrated in a microprocessor.

With reference to FIG. 1, a type III feedforward amplifier is shown. Amplifiers 22 and 52, and couplers 14 and 62 form a network of parallel amplifiers. In this case, the coupler 14 and 62 are 180 degree 3 dB couplers. The coupler 14 splits a desired input signal 12 power between amplifiers 22 and 52. The coupler 62 combines the output power of amplifiers 22 and 52 for a combined power level at output 64.

The input signal 12 is passed through coupler 14 which produces signals 16 and 45. The signals 16 and 45 are substantially similar in amplitude and have approximately 180 degrees phase difference. The signal 16 is passed through coupler 18 producing signal 30 as a sample of signal 16, and an input signal 20 to amplifier 22. The signal 30 is passed through delay 32 to produce signal 34. The components of desired signal 12 are the main components of signal 34.

The signal 20 passes through amplifier 22 which produces a signal 24. The components of desired signal 12 plus components of undesired error signal produced by amplifier 22 are the components of signal 24. By passing the signal 24 through a coupler 26, two samples of signal 24 are supplied as signals 28 and 56, thus, each of these signals include the components of desired signal 12 plus the components of error signal produced by amplifier 22.

The delay 32 is set such that the group delay from coupler 18 to coupler 36 through delay 32 is approximately equal to group delay from coupler 18 to coupler 36 through amplifier 22 and coupler 26. The coupler 36 combines the signals 28 and 34 to produce signal 38. The couplers 18, 26, and 36 and delay 32 are set such that the desired signal components 12 in signal 34 after it has passed through coupler 36 is substantially similar in amplitude and approximately 180 degrees out of phase from the desired signal component 12 in signal 28 after it has passed through coupler 36. This is the first condition, among three conditions, that should be satisfied in controlling the type III feedforward amplifier 100. Maintaining this condition results in substantial reduction of the desired signal component in signal 38, and leaving the components of the error signal.

The signal 38 is amplified through an amplifier 40 to produce signal 42 which is coupled to coupler 44. The amplifier 40 is a low power amplifier and typically does not produce noticeable distortion. Therefore, the signal 42 includes substantially the components of error signal that were originally produced by amplifier 22. Also, the signal 45, which only has the desired signal component, is passed through delay 46 to produce delayed signal 48. At this point, coupler 44 combines signals 48 and 42 to produce signal 50. The signal 50, thus, includes the components of desired signal 12, and components of error signal produced by amplifier 22.

The delay 46 is set such that the group delay from copular 14 to coupler 44 through delay 46 is approximately equal to group delay from coupler 14 to coupler 44 through coupler 18, delay 32, coupler 36 and amplifier 40. This should result in producing time synchronization between the signals 42 and 48. This is the second condition that should be satisfied in type III feedforward amplifier 100. Maintaining this condition results in aligning the parallel amplifying paths through amplifiers 22 and 52 such that both feedforward correction and desired signal combining can take place at coupler 62 without loss of amplifier gain, shown in FIG. 1.

The signal 50 is amplified by the amplifier 52 to produce a signal 54 in this leg of parallel amplifying path. The signal 54 has components of distortion produced by amplifier 52. The amplifiers 22 and 52 are substantially similar amplifiers. In the other amplifying path, signal 20 is amplified through amplifier 22 to produce signal 24. The signal 24 after passing through coupler 26 is coupled to delay 58 as signal 56. The signal 56 passes through delay 58 to produce signal 60. The components of desired signal 12 plus the components of error signal produced by amplifier 22 are the components of signal 60. The delay 58 is such that when the desired signal components present in signal 60 passes through coupler 62 the amplitude is substantially similar and the phase is approximately equal with the desired signal component present in signal 54 after it has passed through coupler 62. As a result, the desired signal component are added in coupler 62 to produced the amplified desired signal 64.

The components of error signals produced by amplifier 52 which are present in signal 54 are 180 degrees out of phase with components of error signal present in signal 42 produced by amplifier 22. The components of error signal in signal 50 derived from signal 42 are preconditioned, otherwise known as predistorted. Signal 50 is amplified by amplifier 52 to produce signal 54. The residual error signals left in signal 54 after it has passed through coupler 62 are approximately at the same amplitude and 180 degrees out of phase with the error signals component present in signal 60 after it has passed through coupler 62. This is the third condition that should be satisfied in controlling type III feedforward amplifier 100. Maintaining this condition results in substantially reducing the error signals at the output signal 64.

Figure 2:
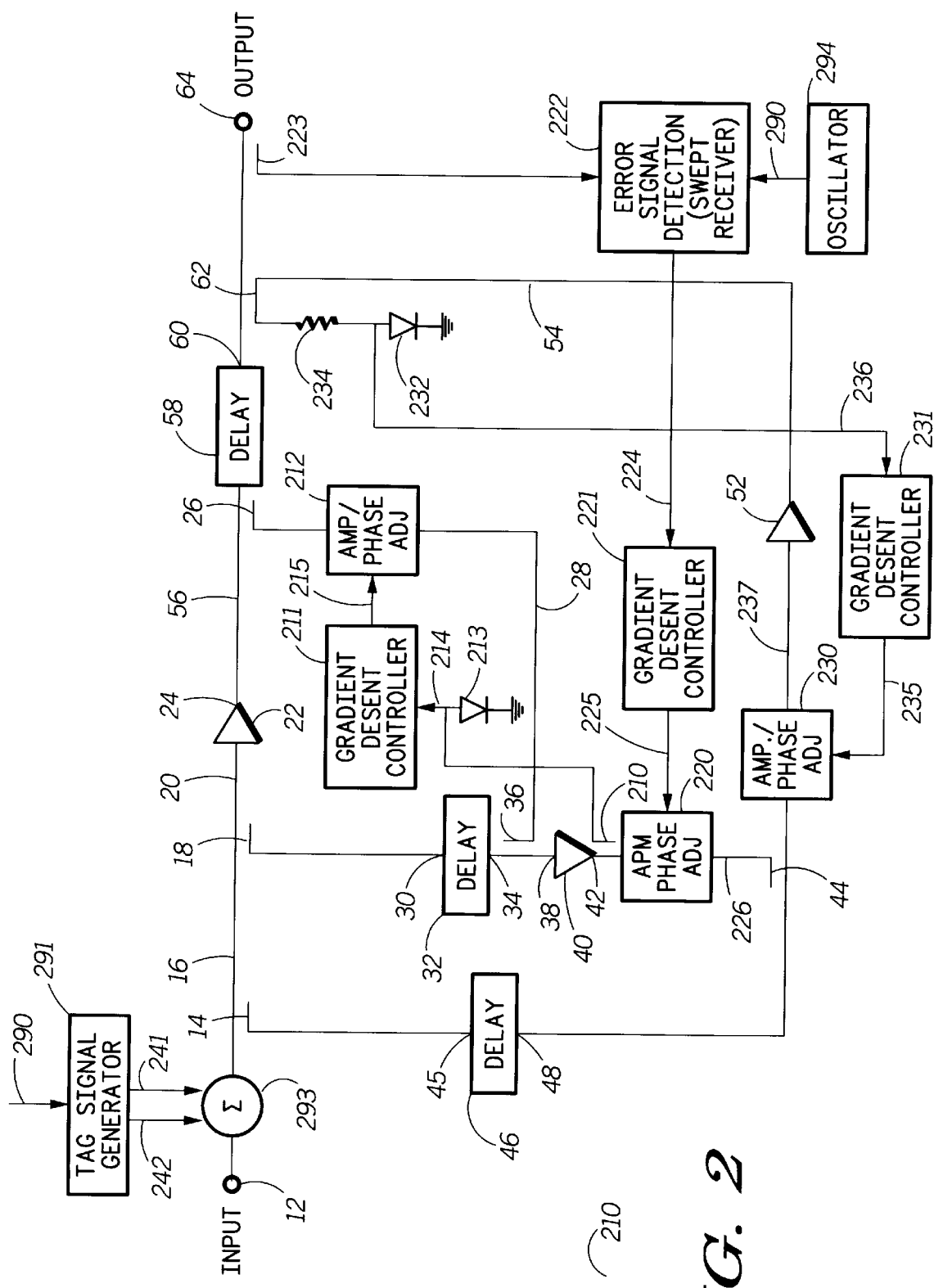
FIG. 2 depicts a type III feedforward amplifier in accordance with the present invention.

According to the present invention, the overall control of type III feedforward amplifier 100 is accomplished by including three control loops into the amplifier 100 circuit. These three control loops maintain the above mentioned three conditions by making various adjustments at various points of amplifier 100. With reference to FIG. 2, these three control loops are shown. The first loop includes coupler 210, detector 213, gradient decent controller 211, and amplitude and phase adjuster 212. The coupler 210 is sampling signal 42 and feeding the sampled signal to detector 213. The detector 213 is detecting the sampled signal power level and producing a DC signal 214 representing the sampled power level. The gradient decent controller 211 is producing signal 215 based on the signal 214. The details of gradient decent controller operation are explained below. The signal 215 is coupled to amplitude and phase adjuster 212. The phase and amplitude of the sampled signal at coupler 26 are adjusted by 212 according to input signal 215 to produce signal 28. The signal 28 is then meeting the phase and amplitude levels that are required to satisfy the first condition. As the result, the carrier cancellation effectively takes place at coupler 36.

Figure 3:
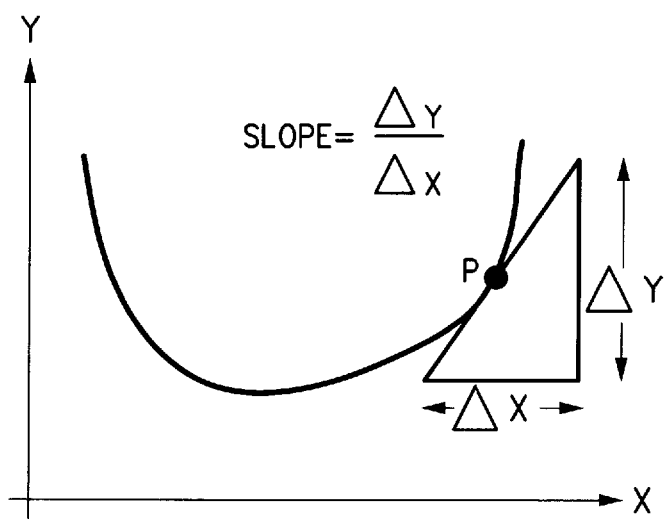
FIG. 3 depicts a graphical representation of a gradient decent controller function.

The operation of gradient decent controller is well known. To describe briefly, a gradient decent controller is a controller which its controlling function is based on a mathematical formulation having a parabolic graphical representation. If the input signal is the value on the x-axis, the output signal is the value on the y-axis as shown in FIG. 3. This type of controller iteratively selects a value for the input signal which results in an increasingly smaller output signal. In this case, the phase and amplitude of a signal is iteratively adjusted until the output signal converges on its minimum value. In a practical application, input noise produces an output which never attains an absolute minimum level. Nevertheless, on average, the signal remains close to the minimum value.

To satisfy the second condition, a second control loop adjusts the amplitude and phase of signal 42 such that distortion (IM) suppression at coupler 62 is maximized. This is achieved in part by creating approximately zero phase and amplitude difference between signals 226 and 48 at coupler 44. As shown in FIG. 2, the second control loop includes an amplitude and phase adjuster 220, gradient decent controller 221, error signal detector 222, and coupler 223. The output signal 64 is sampled at coupler 223. The sampled signal is coupled to error signal detector 222. The detector 222 is responsive to the power level of error signal components of output signal 64. The detected error signals power are rectified and produced as DC signal 224. The signal 224 is coupled to gradient decent controller 221 to produce signal 225. The signal 225 accordingly controls the amplitude and phase adjustments of 220.

A third control loop adjusts the phase and amplitude of signal 50 to produce signal 237. The third loop includes amplitude and phase adjuster 230, gradient decent controller 231, and detector 232. The detector 232 detects the power level of signal 54 reaching terminating element 234 in coupler 62, and produces a DC signal 236 representing the detected power level. Based on signal 236 DC level, the gradient decent controller 231 produces an output 235 for controlling phase and amplitude adjuster 230. The amplitude and phase adjuster 230 according to control signal 235 adjusts the signal 50 phase and amplitude to produce signal 237. The operation of the third loop minimizes the amount of signal 54 reaching the element 234 and maximizing the desired signal combining in coupler 62, thereby, improving the efficiency of the overall type III amplifier in comparison to conventional feedforward amplifiers. In conjunction with other control loops, the third loop also substantially reduces the distortion in output signal 64.

To begin the operation of feedforward amplifier controller as shown in FIG. 2, the input signal 12 is combined in 293 with two other signals, 241 and 242. The operation of an amplifier in a communication system very often is confined to a limited frequency bandwidth, although the amplifier is capable of amplifying signals in a wide range of frequencies. According to the present invention, the added signals 241 and 242, herein called tag signals, have frequencies out of the communication system bandwidth. This is more clearly shown in FIG. 4. The signals collectively shown as 403 are at the system carrier frequencies and viewed as the desired signals. The signals 241 and 242 are the tag signals and shown to be outside the frequency bandwidth of the communication system. The signals collectively shown as 404 are the error signals, IM products, produced at various stages of an amplifier as one may find in a prior art feed-forward amplifier.

Figure 4:
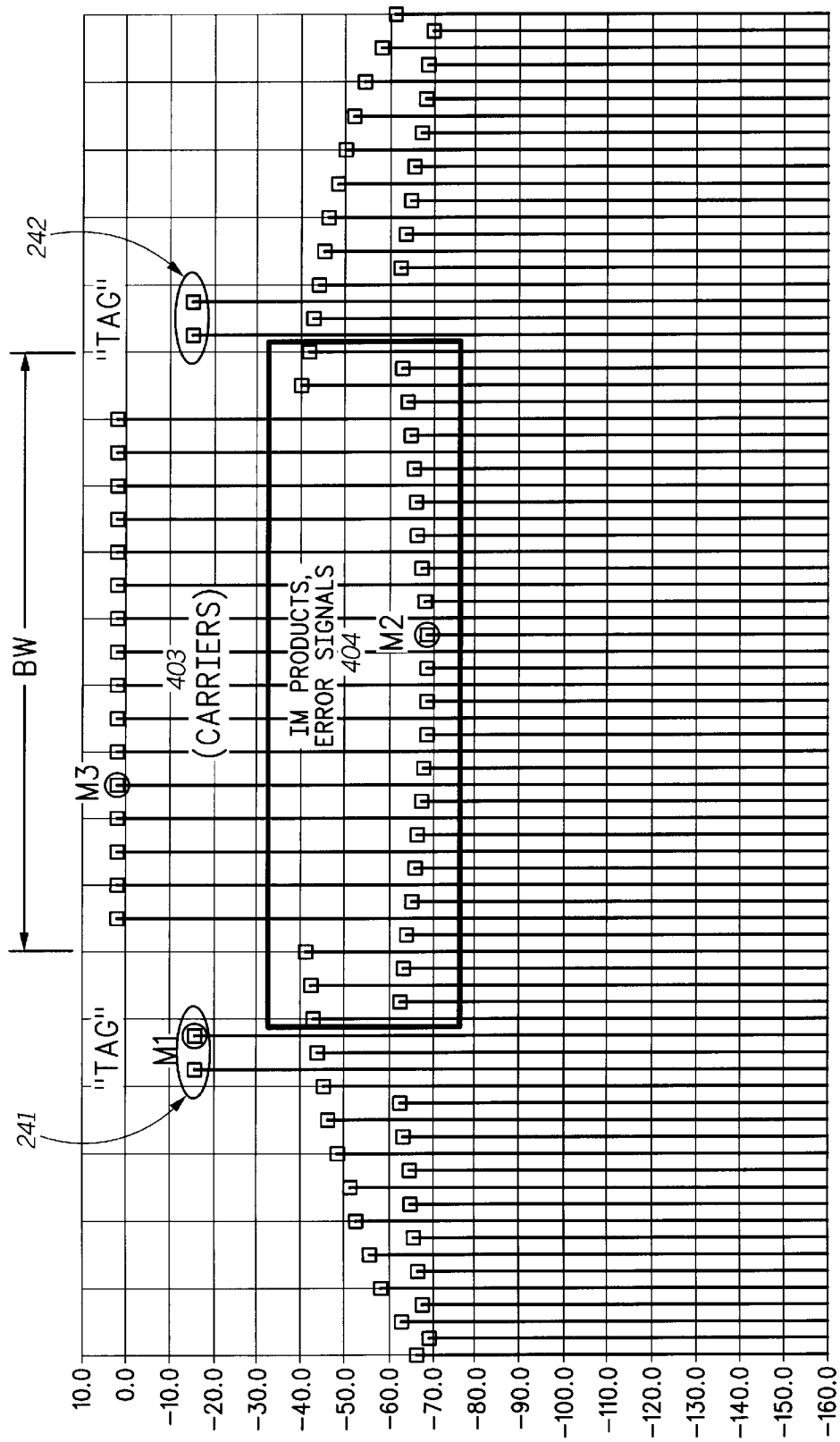
FIG. 4 depicts frequency spectrum of tag signals, in band carrier signals, and IM signals produced in a type III feedforward amplifier.

The tag signals 241 and 242 are summed in 293 with the desired signal 12 at the input of the amplifier as shown in FIG. 2. The tag signal amplitude levels are lower than the desired signals amplitude levels when they are combined. A low level tag signal injection insures that only a small fraction of the amplifier output signal energy is expended in tag signals frequencies. The tag signals are either modulated or unmodulated. In the preferred embodiment, the tag signals are suppressed carrier amplitude modulated (AM) tones. With reference to FIG. 4, tag signals 241 and 242 each consists of two signals. These two signals are in frequency offset for approximately more or less than the channel spacing frequency of the communication system. Thus, a series of intermodulation products are developed by the tag signals that are distinct from intermodulation products produced by the carriers. For example, in a 25 KHz channel spacing communication system, the two components of each tag signal may be 30 KHz apart.

The tag signals produce IM products, error signals, in the frequency band of the communication system. However, the IM products produced as the result of tag signals are lower in amplitude than the IM products generated by the amplifiers. In the preferred embodiment, the amplitude of the IM products produced as the result of the tag signals are maintained by adjusting either frequencies, amplitudes, or AM modulation frequency of tag signals.

With reference to FIG. 2, the error signal detector is selectively detecting the error signals in the pass band of the system. This frequency selected detection is very often accomplished by a detector receiver 222. The detector 222 tunes its receiving center frequency with reference oscillator signal 290 generated from an oscillator 294. In a preferred embodiment, this oscillator 294 provides signal 290 to tag signal frequency generator 291, such that the operation of the detector 222 is phased locked with tag signal generator 291. This phase lock operation minimizes between 222 and 291 the effect of frequency drift differences produced as a result of system variations.

Figure 6:
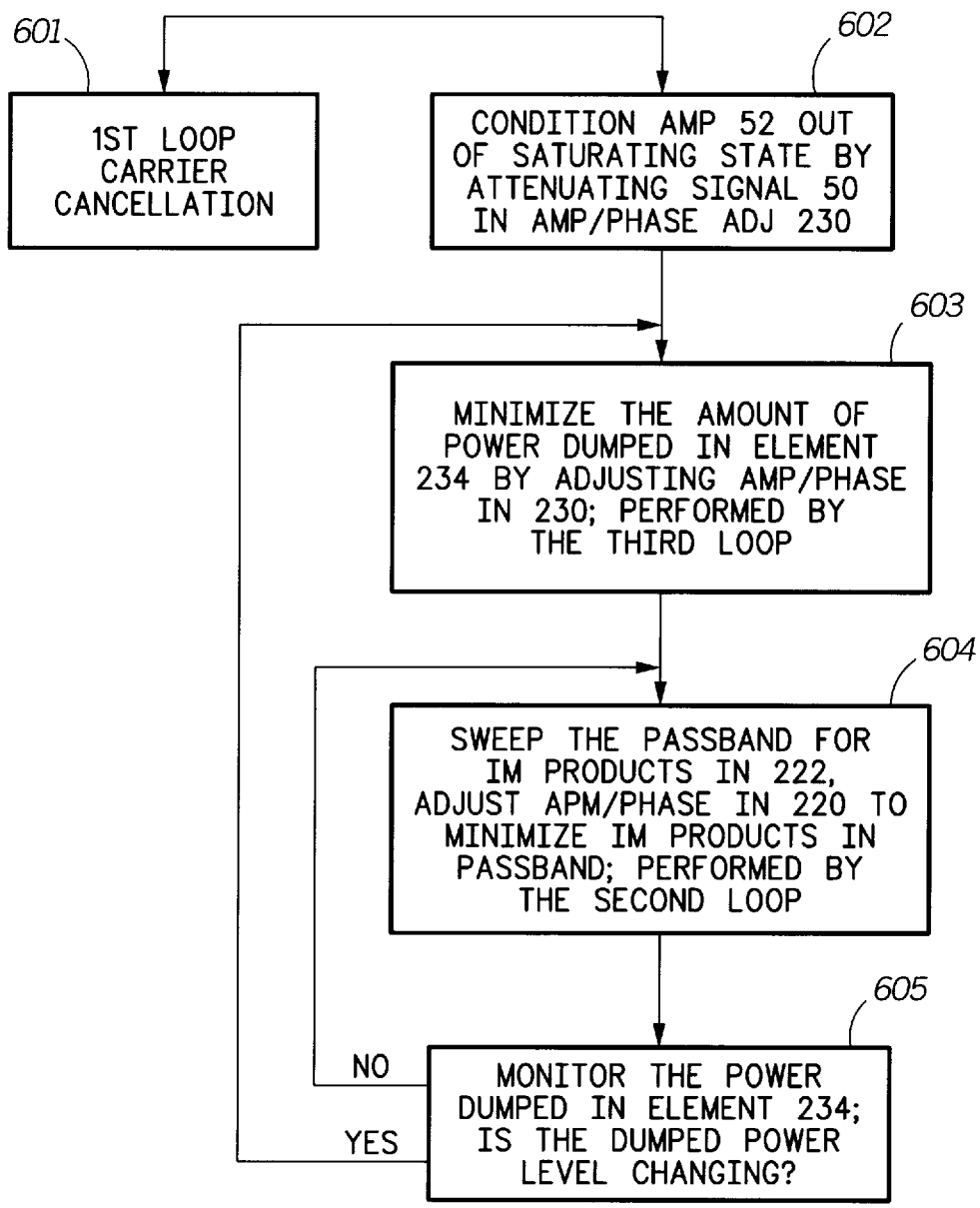
FIG. 6 depicts a flow chart outlining the steps taken by the control loops in a type III feedforward amplifier in accordance with another aspect of the present invention.

While the tag signals 241 and 242 are injected in the feedforward amplifier in a manner as explained above, the first loop as described above functions independently of the other two control loops. The first loop cancels the components of carrier signal from signal 38, and leaves the components of error signals to pass to amplifier 40 which results in producing amplified error signals 42. The signal 42 is substantially free of components of carrier signal. The functioning order of the second and third loops are best understood with reference to FIG. 6. The steps 602, 603, 604 and 605 take place independently of the first loop carrier cancellation step 601.

The step 602 prevents amplifier 52 from reaching saturated output power. In the preferred embodiment, until carrier cancellation step 601 is achieved, step 602 is being accomplished by throttling the amplitude adjustment in 230 to full attenuation, thereby, preventing amplifier 52 saturation. At the next step 603, the second loop minimizes the amount of power reaching element 234 by adjusting the amplitude and phase of the input signal to 230. This allows maximum carrier signal coupling at the coupler 62, whereby, improving the efficiency of the overall amplifier and producing signal 64 at its maximum power level.

Next, at step 604, the power level of IM products in signal 64 are detected in error signal detector 222. An average power level of all tag signals generated IM products detected in signal 64 is passed to gradient decent controller 221 as explained above. The swept detection of components of error signal in signal 64, in an embodiment of the present invention is limited to the entire communication system frequency bandwidth. In other embodiments, step 604 is terminated when sweeping a portion of the frequency bandwidth, less than the entire bandwidth, has been completed for detecting the error signals.

In step 605, a comparator compares the detected power in element 234 in step 603 to the amount of power detected after the step 604 has taken place. The amount of detected power in 234 will change if the amplifier output power shifts or other changes such as shifts in power supply occur. If the amount of detected power in 234 has changed, the controller returns to step 603 and repeat the steps 603 and 604, and then again step 605. If the amount of power level has not changed, the controller is instructed to go back to step 604 and repeats step 604, and then again step 605. The control system compares the changes in detected power in 234 to a threshold value. If the change exceeds the threshold value the controller returns to step 603.

Figure 5:
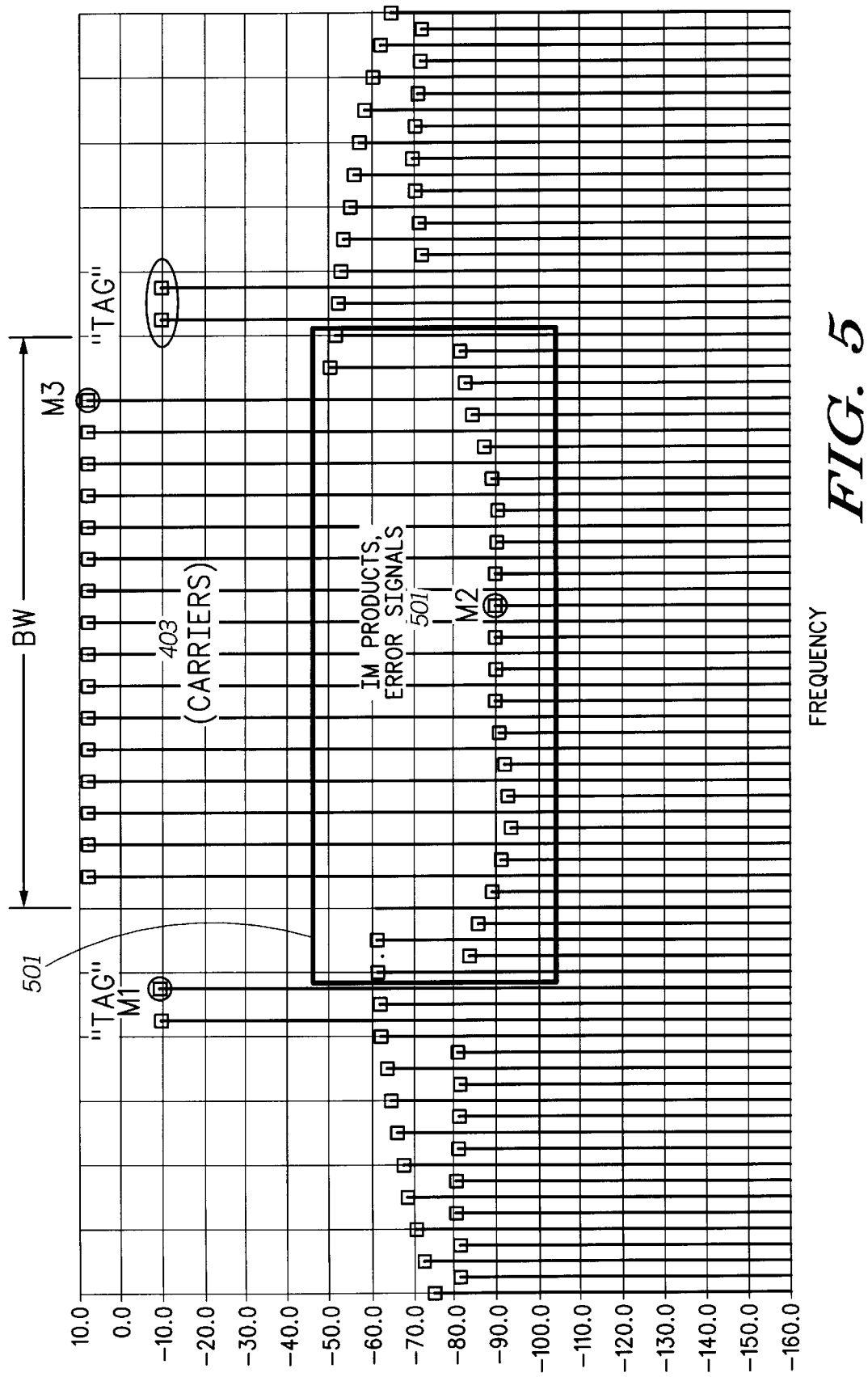
FIG. 5 depicts frequency spectrum of tag signals, in band carrier signals, and IM signals produced in a type III feedforward amplifier in accordance with an aspect of the present invention.

With reference to FIG. 5, after implementing the present invention in controlling the error signals, the components of the error signal at the output of the feedforward amplifier are shown. A comparison of FIGS. 4 and 5 clearly indicates that the amplitude of the error signals in the passband at the output has been substantially reduced. In a practical application of the present invention where transmission of out of band signals are prohibited or limited, the output signal is passed through a passband filter to filter the components of the tag signals present at the output.

While the invention has been particularly shown and described with reference to a particular embodiment, it will be understood by those skilled in the art that various changes in form and details may be made therein without departing from the spirit and scope of the invention. The corresponding structures, materials, acts and equivalents of all means or step plus function elements in the claims below are intended to include any structure, material, or acts for performing the functions in combination with other claimed elements as specifically claimed.

I claim:

1. In a feedforward amplifier having a first and second parallel amplifying paths, said first path including a first amplifier, said second path including a second amplifier, a desired signal to be amplified is summed with a pair of tag signals producing a summed signal, said summed signal is split into a first and a second signal, said first split signal is inputted to said first amplifying path to be amplified by said first amplifier producing said first amplified signal, said second split signal is inputted to said second amplifying path to be amplified by said second amplifier producing a second amplified signal, said first and second amplified signals are coupled in a first coupler producing an amplified said desired signal, a method for producing said amplified desired signal comprising the steps of:

canceling from a sample of said first amplified signal components of said desired signal, thereby leaving an error signal from said sampled signal having error components present at output of said first amplifier;

coupling said error signal with said second split signal before being inputted to said second amplifier;

detecting power level of a leaked signal from said first coupler while said first and second amplified signals are being coupled in said first coupler; and adjusting amplitude and phase of a coupled signal produced at said coupling step according to a first gradient decent controller output signal which is based on said detected power level of said leaked signal.

2. The method as recited in claim 1 further comprising the steps of:

sweeping said amplified desired signal for components of error signals, produced by summing said tag signals, to produce a DC signal representing an average total power of error signals present in said amplifier desired signal; and adjusting phase and amplitude of said error signal before said coupling step according to a second gradient decent controller output signal which is based on said DC signal produced in said sweeping step.

3. The method as recited in claim 2 further comprising the step of repeating said sweeping step and said adjusting step of said error signal while monitoring said detected power level fluctuations.

4. The method as recited in claim 3 further comprising the step of repeating said adjusting step of said coupled signal when said detected power level fluctuation exceeds a predetermined threshold level.

5. The method as recited in claim 1 further comprising the step of preventing said second amplifier from entering saturation before said detecting step.

6. The method as recited in claim 1 wherein said canceling step further including the steps of:

sampling said first split signal for being inputted to a low power amplifier;

sampling an output signal of said low power amplifier;

detecting power level of said sampled output signal;

adjusting said sampled first amplified signal phase and amplitude according to a third gradient decent controller output based on said detected power level of said sampled output signal; and coupling said adjusted sampled first amplified signal with said sampled first split signal before being inputted to said low power amplifier, thereby said output signal of said low power amplifier is said error signal.

7. The method as recited in claim 1 wherein said amplifier is operating in a communication system having transmit signals confined within a band of frequencies and said tag signals frequencies are in a range of frequencies out of said band of frequencies.

8. The method as recited in claim 1 wherein said tag signals are amplitude modulated with suppressed carrier tones.

9. The method as recited in claim 1 wherein each of said tag signals have two frequency components being apart in frequency in a range of frequencies out of a channel bandwidth frequency of said communication system.

10. The method as recited in claim 2 wherein said sweeping step is performed in phase lock with said tag signals.

11. An apparatus for amplifying a desired signal, comprising:

a first amplifying path;

a second amplifying path;

a first coupler summing outputs of said first and second amplifying paths producing an output signal;

a summer summing said desired signal with a plurality of tag signals producing a summed signal;

a splitter splitting said summed signal into a first summed signal to be passed to said first amplifying path producing an amplified first summed signal, and a second summed signal;

means for a first control loop sampling said amplified first summed signal and canceling components of said desired signal from said sample signal producing a first error signal;

a receiver based on a reference oscillator signal detecting a frequency band of said output signal for signal components other than components of said desired signal and producing a first DC signal representing cumulative power level of said detecting;

a first amplitude and phase adjuster adjusting phase and amplitude of said first error signal based on a first control signal generated from a first gradient descent controller which is based on said first DC signal to produce an amplitude and phase adjusted first error signal;

a second coupler summing said second summed signal after being delayed with said amplitude and phase adjusted first error signal producing a third summed signal;

a detector detecting leaking power at said first coupler producing a second DC signal representing detected power level which is passed to a second gradient decent controller producing a second control signal;

a second phase and amplitude adjuster adjusting said third summed signal according to said second control signal before said third summed signal is passed to said second amplifying path; and a generator generating said tag signals in phase lock with said reference oscillator signal.

* * * * *